United States Patent [19]
Kobiki

[11] Patent Number: 5,138,439
[45] Date of Patent: Aug. 11, 1992

[54] SEMICONDUCTOR DEVICE

[75] Inventor: Michihiro Kobiki, Itami, Japan

[73] Assignee: Mitsubishi Denki Kabushiki Kaisha, Japan

[21] Appl. No.: 671,167

[22] Filed: Mar. 15, 1991

Related U.S. Application Data

[63] Continuation of Ser. No. 440,400, Nov. 22, 1989, abandoned.

[30] Foreign Application Priority Data

Apr. 4, 1989 [JP] Japan ..................... 1-93578

[51] Int. Cl.⁵ ............... H01L 39/02; H01L 23/02
[52] U.S. Cl. .................................. 357/80; 357/81
[58] Field of Search ..................... 357/81, 80, 67

[56] References Cited

U.S. PATENT DOCUMENTS

| | | | |
|---|---|---|---|
| 3,456,335 | 7/1969 | Hennings et al. | 357/49 |
| 3,846,824 | 11/1974 | Bell | 357/80 |
| 3,986,196 | 10/1976 | Decker et al. | 357/22 |
| 4,926,242 | 5/1990 | Itoh et al. | 357/81 |

FOREIGN PATENT DOCUMENTS

| | | | |
|---|---|---|---|
| 2042494 | 3/1972 | Fed. Rep. of Germany . | |
| 3132555 | 6/1982 | Fed. Rep. of Germany . | |
| 3115017 | 11/1982 | Fed. Rep. of Germany . | |
| 3314996 | 10/1983 | Fed. Rep. of Germany . | |
| 3523061 | 1/1987 | Fed. Rep. of Germany | 357/81 |
| 3709200 | 9/1988 | Fed. Rep. of Germany . | |
| 58-35956 | 3/1983 | Japan | 357/81 |
| 58-48926 | 3/1983 | Japan | 357/81 |
| 58-125854 | 7/1983 | Japan | 357/81 |
| 59-124750 | 7/1984 | Japan . | |
| 59-145547 | 8/1984 | Japan . | |
| 60-66842 | 4/1985 | Japan | 357/81 |
| 61-184859 | 8/1986 | Japan . | |
| 62-81047 | 4/1987 | Japan . | |
| 62-122157 | 6/1987 | Japan . | |
| 63-296361 | 12/1988 | Japan | 357/81 |

OTHER PUBLICATIONS

Aakalu et al., "Thermal Grease With Boron Or Aluminum Nitride And Mineral Oil", IBM Technical Disclosure Bulletin, vol. 24, No. 7A, Dec. 1981, p. 3530.

Mondou et al., "Heat Transfer Compound", IBM Technical Disclosure Bulletin, vol. 25, No. 10, Mar. 1983, p. 5322.

Iwase et al., "Aluminum Nitride Substrates Having High Thermal Conductivity", Solid State Technology, 1986, pp. 135-138.

Primary Examiner—Andrew J. James
Assistant Examiner—D. Monin
Attorney, Agent, or Firm—Leydig, Voit & Mayer

[57] ABSTRACT

A semiconductor device includes a successively disposed a radiating electrode and hard radiating layer at the rear surface of a semiconductor wafer substrate which is divided into a plurality of semiconductor chips wherein the semiconductor chip includes the hard radiating layer having outer dimensions larger than that of substrate of said semiconductor chip.

1 Claim, 9 Drawing Sheets

SEMICONDUCTOR DEVICE

This application is a continuation of application Ser. No. 440,400, filed Nov. 22, 1989, now abandoned.

FIELD OF THE INVENTION

The present invention relates to a semiconductor device, and, more particularly, to a device that has a plated heat sink (hereinafter referred to as PHS) at the rear surface of a semiconductor chip. The present invention further relates to a method for producing such a device.

BACKGROUND OF THE INVENTION

FIG. 5 shows a prior art semiconductor device including a PHS. In FIG. 5, reference numeral 1 designates a semiconductor device obtained by mounting a semiconductor chip 5 on a carrier 7, such as Cu or, by solder 6. The semiconductor chip 5 includes a semiconductor chip substrate 3, such as Si or GaAs, function element layers 2 and a PHS 4 at the rear of semiconductor chip substrate 3 formed by Au, Ag, or Cu plating.

The prior art production method for the semiconductor device is be described with reference to FIGS. 6(a) to 6(d).

An initial semiconductor substrate 8, such as Si or GaAs, having a thickness of about 600 microns has active elements and passive elements produced at its surface and thereafter, a function element layer 2 is prepared by on the substrate 8 (FIG. 6(a)).

Next, the semiconductor wafer substrate 8 is thinned to a predetermined thickness with due regard to heat radiation and mounting work, that is, to about 100 microns by lapping, polishing, or etching. Thereafter, a Ti, Ni, or Cr layer that adheres well to the substrate 8 is deposited in an evaporative process on the rear surface of substrate 8. A rear surface electrode 9 comprising an Au layer with a thickness of about 3000 angstroms is deposited by electroless plating (FIG. 6(b)).

Thereafter, a PHS 4 comprising a Au layer with a thickness of about 40 to 50 microns is deposited on the rear surface electrode 9 by an electrolytic plating (FIG. 6(c)). Finally, the semiconductor wafer substrate 8 and the PHS 4 are cut along a predetermined cutting line by, for example, a dicer, whereby semiconductor chips 5 are produced (FIG. 6(d)).

Another prior art production method for the semiconductor device is be described with reference to FIGS. 7(a) to 7(d).

The production processes before the deposition of the rear surface electrode 9 at the rear surface of the semiconductor wafer 8 (FIGS. 7(a) and 7(b)) are the same as those shown in FIGS. 6(a) and 6(b).

After the rear surface electrode 9 is produced, a PHS photoresist pattern 10 is deposited on the rear surface of substrate 8 corresponding to the chip patterns of the function element layer 2, that is, element patterns of active elements, passive elements, or a wiring layer (FIG. 7(b)). Thereafter, PHS 4 is selectively produced using the photoresist pattern 10 as a mask, by electrolytic plating and the photoresist pattern 10 is removed (FIG. 7(c)). Finally, the rear surface electrode 9 and the semiconductor wafer substrate 8 are successively etched, whereby a semiconductor chips 5 are produced.

In this method, the outer configuration size of PHS 4 is more or less larger than the semiconductor chip substrate 3 as shown in FIG. 7(d). As shown in FIG. 9, the distance 1 from the edge of semiconductor chip substrate 3 to the edge of PHS 4 is determined in accordance with he thickness D of PHS 4. For example, when the thickness D is 40 to 50 microns and the photoresist pattern thickness d is 3 to 10 microns, the distance 1 is at most 30 to 35 microns.

The semiconductor chip 5 produced by the method shown in FIG. 6 or 7 is mounted on the carrier 7 using soldering material 6 as shown in FIG. 5.

Firstly, the carrier 7 is heated, and soldering material 6 is applied on the entire surface of carrier 7. Thereafter, the semiconductor chip 5 is picked up using tweezers 30, as shown in FIGS. 11(a) and 11(b), and put on the carrier 7. The chip 5 is scrubbed on the carrier 7 such that the oxide film at the surface of soldering material 6 is forced aside thereby bringing the rear surface of chip 5 into contact with the active soldering material 6 below the oxide film. Thereafter, the device is cooled, and the semiconductor device 1 is completed.

In the prior art semiconductor chip of such construction, there are problems in handling and semiconductor chip during adhering of the semiconductor chip to a carrier using solder.

(1) In the semiconductor chip 5 produced by the method shown in FIGS. 6(a)-(d), the area of the PHS 4 and of the semiconductor chip substrate 3, that is, the outer configuration sizes thereof are equal to each other and the side surfaces thereof are approximately flush. Therefore, while placing the semiconductor chip 5 on the carrier 7, cracking or chipping of the semiconductor chip substrate 3 can occur from tweezers 30 or a collet (not shown) that contacts the semiconductor chip substrate 3 as shown in FIG. 11(a), damaging the device.

In the semiconductor chip 5 produced by the method shown in FIG. 7, although the outer configuration size of the PHS 4 is more or less larger than that of the semiconductor chip substrate 3, since the PHS 4 consists of a soft material such as gold, the PHS 4 is deformed when it is picked up by tweezers 30, and the tweezers 30 come in contact with the semiconductor chip substrate 3 as shown in FIG. 11(b), damaging substrate 3.

(2) When the semiconductor chip 5 is soldered onto the carrier 7, the temperature is raised to about 300° to 400° C. and the semiconductor chip substrate 3 is deformed due to the difference in the thermal expansion coefficients of the semiconductor chip substrate 3, the PHS 4, and the carrier 7. To be more precise, the thermal expansion coefficient of the semiconductor chip substrate (GaAs) 3 ($5.5 \times 10^{-6}$/° C.) is lower than that of PHS (Au) 4 ($15.4 \times 10^{-6}$/° C.) and that of the carrier (Cu) 7 ($18.3 \times 10^{-6}$/° C.). As shown in FIG. 10(a), the chip 5 is deformed upon receiving the force F so that both sides warp at high temperature. Such a deformed chip 5 is mounted onto the carrier with a residual stress applied to the semiconductor substrate 3, causing deterioration of the operating characteristics and reliability of the device.

SUMMARY OF THE INVENTION

It is an object of the present invention to provide a semiconductor device for preventing the handling tool from contacting with the semiconductor chip substrate during treatment of the semiconductor chip, and avoiding the deformation of the semiconductor chip substrate during mounting thereof.

It is another object of the present invention to provide a method of producing such a semiconductor device.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a semiconductor chip includes a semiconductor chip substrate, a radiating electrode, and a hard radiating layer which are successively laminated on the rear surface of the semiconductor chip substrate, and the outside dimensions of the hard radiating layer are larger than that of the semiconductor chip substrate. Therefore, even when the radiating layers at the rear surface of the semiconductor chip substrate are picked up by tweezers, the hard radiating layers are not deformed because the tweezers do not come in contact with the semiconductor chip substrate while treating the chip, whereby the destruction of the chip substrate is avoided.

According to a second aspect of the present invention, the radiating layer comprises a radiating electrode on the rear surface of the semiconductor chip substrate having a thermal expansion coefficient approximately equal to that of the semiconductor chip substrate. Therefore, when the semiconductor chip is mounted on the carrier by high temperature soldering, the deformation of the semiconductor chip substrate due to the heat is prevented by the radiating layer, and the semiconductor chip a non-deformed chip substrate is mounted on the carrier.

According to a third aspect of the present invention, a semiconductor chip is provided with a grounding radiating electrode and an insulating radiating layer successively laminated on the rear surface of the chip substrate, and the semiconductor chip is fixed onto a carrier having a concave portion deeper than the thickness of the insulating radiating layer such that the semiconductor chip is arranged inside the concave portion, and a solder is disposed between the side surface of the chip and the internal surface of the concave portion. Therefore, the grounding radiating electrode can be electrically connected with the carrier via the solder, whereby the high frequency characteristics of the device are enhanced.

According to a fourth aspect of the present invention, a semiconductor chip includes a semiconductor chip substrate, a grounding radiating electrode at the rear surface of chip substrate, and an insulating radiating layer having through-holes filled up with metal material and disposed on the electrode, and the semiconductor chip is fixed on a carrier by a soldering material. Therefore, the grounding radiating electrode can be electrically connected with the carrier via the through-holes, thereby enhancing the high frequency characteristics of the device.

According to a method of producing a semiconductor device of the present invention, the process of dividing a semiconductor wafer substrate into a plurality of semiconductor chips comprises cutting the wafer substrate along a predetermined cutting line with a first blade and cutting a PHS and the insulating radiating layer at the rear surface of the substrate from the surface side of the substrate along a cutting line with a second blade thinner than the first blade. Therefore, the cutting of the substrate, the PHS, and the radiating layers are executed mechanically, and the outer configuration sizes of the semiconductor chip substrate, the PHS, and the insulating radiating layer can be precisely controlled. Furthermore, the cutting takes place so that a semiconductor wafer substrate comprising a soft material can be softly cut without generating breakages or cracks, and the radiating layers comprising hard materials can be cut.

DETAILED DESCRIPTION OF THE PREFERRED EMBODIMENTS

An embodiment of the present invention will be described in detail with reference to the drawings.

Figure 1:
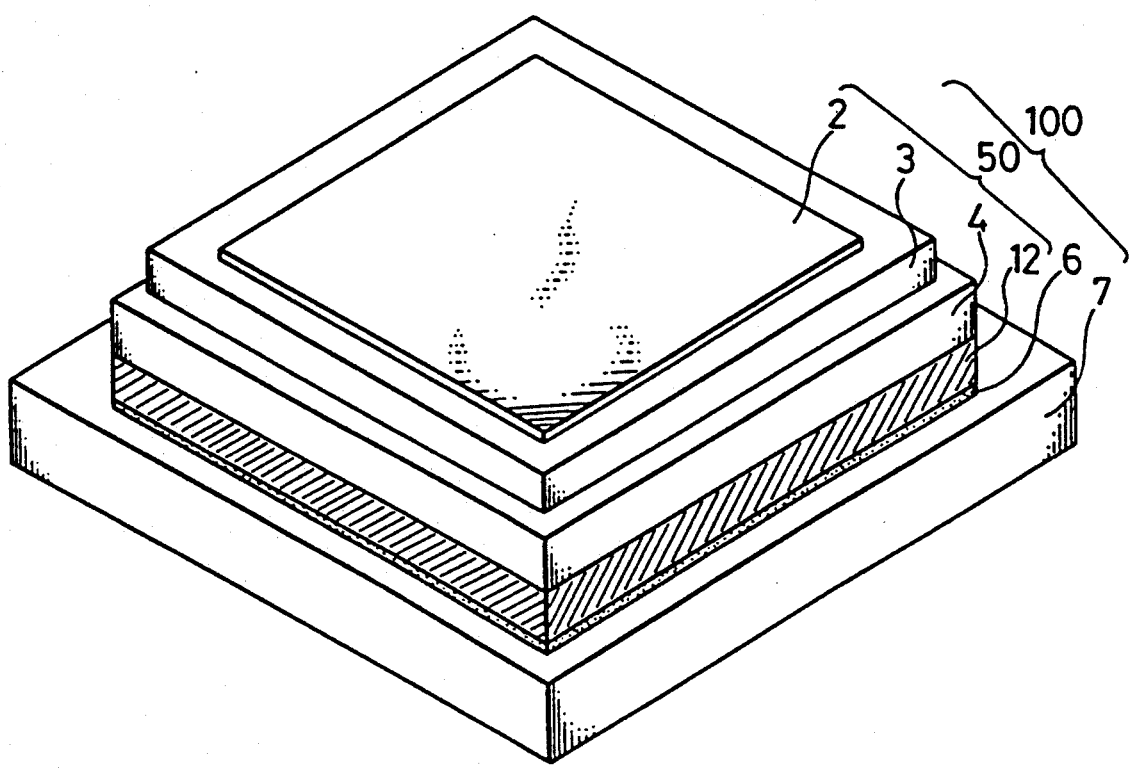
FIG. 1 a perspective view of a semiconductor device according to a first embodiment of the present invention.

FIG. 1 shows a perspective view of a semiconductor device according to a first embodiment of the present invention. In FIG. 1, reference numeral 100 designates a semiconductor device a semiconductor chip 50 mounted to a carrier 7 comprising Cu with solder 6. The semiconductor chip 50 includes a semiconductor chip substrate 3 comprising Si or GaAs on which active elements or passive elements are produced, a PHS 4 at the rear surface of the chip substrate 3 by Au plating, and an insulating radiating layer 12 on the surface of the PHS 4, whose front and rear surfaces are metallized with Ti/Au, Ni/Au, or Cr/Au.

The outside dimensions and areas of the PHS 4 and the insulating radiating layer 12 are larger than those of semiconductor chip substrate 3. The sides of PHS 4 and insulating radiating layer 12 are aligned with each other. The insulating radiating layer 12 comprises a material having a thermal expansion coefficient approximately equal to that of the semiconductor chip substrate 3 and having high thermal conductivity. For example, AlN (thermal expansion coefficient: $4.5 \times 10^{-6}/°$ C. thermal conductivity: 2 W/cm ° C.) and BN (thermal expansion coefficient: $3.5 \times 10^{-6}/°$ C., thermal conductivity: 6 W/cm ° C. ) are used. Herein, GaAs as the semiconductor chip substrate material has thermal expansion coefficient of $5.5 \times 10^{-6}/°$ C. and a thermal conductivity of 0.5 W/cm ° C.

Next, a production method for the semiconductor chip of this embodiment will be described with reference to FIGS. 2(a) to 2(d).

Figure 2A:
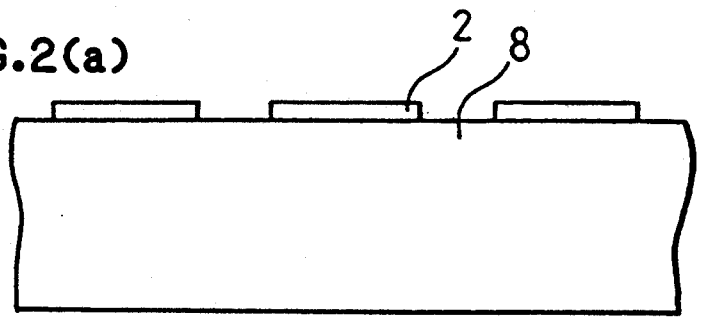
FIGS. 2(a) to 2(d) are cross-sectional views of process steps for producing the semiconductor chip of the semiconductor device of FIG. 1.
Figure 2B:
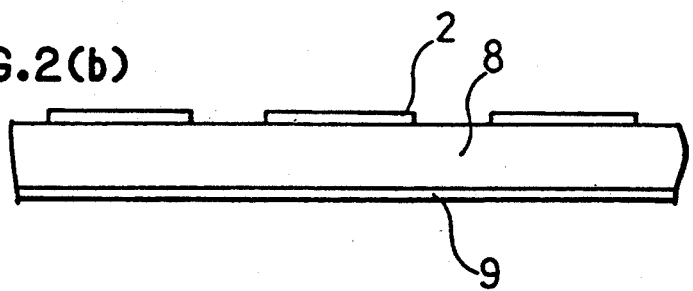
Figure 2C:
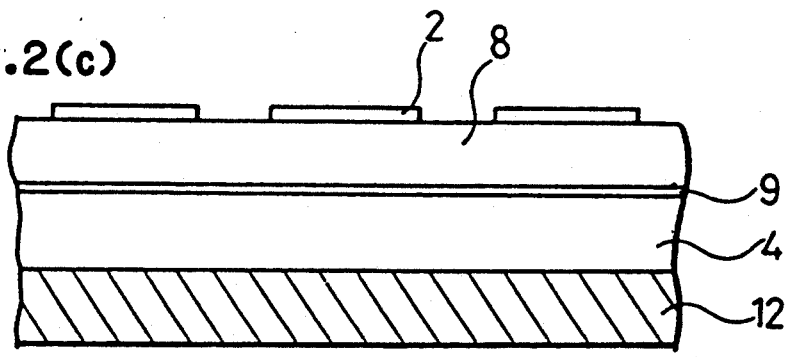
Figure 2D:
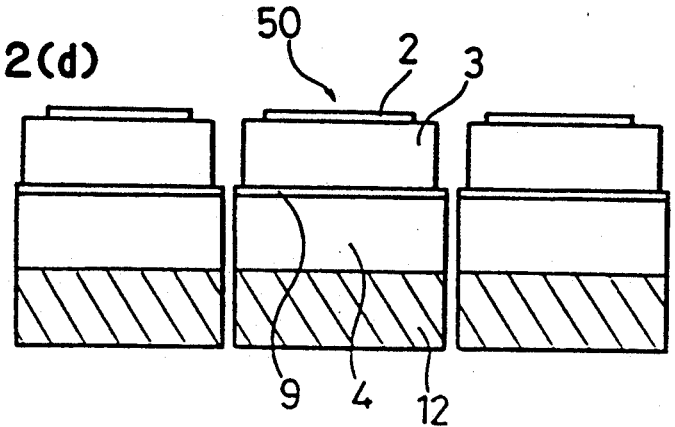
Figure 6A:
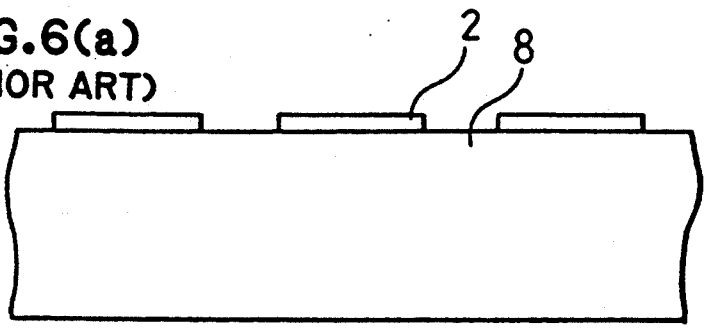
FIGS. 6(a) to 6(d) are cross-sectional views of process steps for producing a semiconductor chip of the semiconductor device of FIG. 5.
Figure 6B:
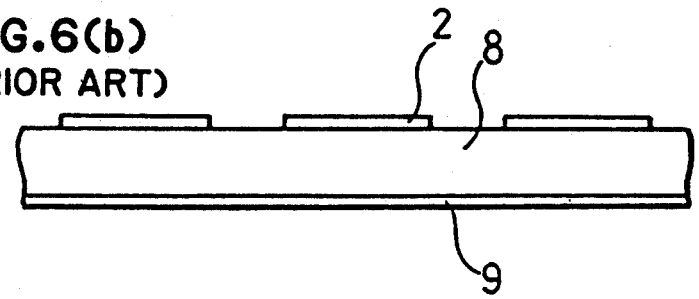
Figure 6C:
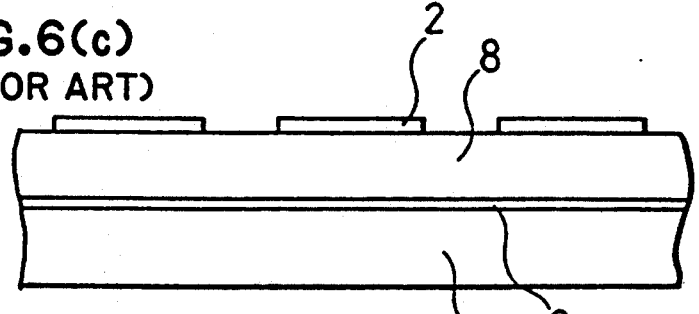
Figure 6D:
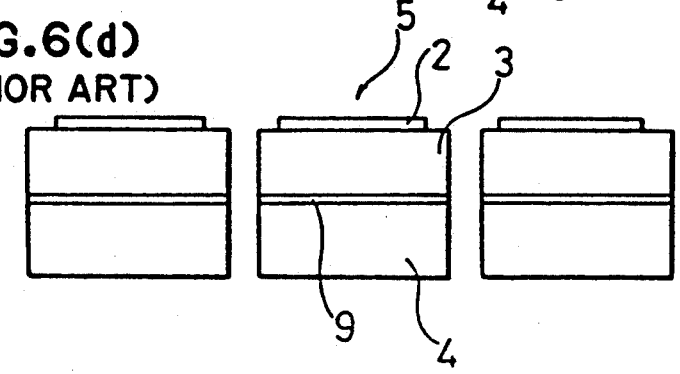
Figure 7A:
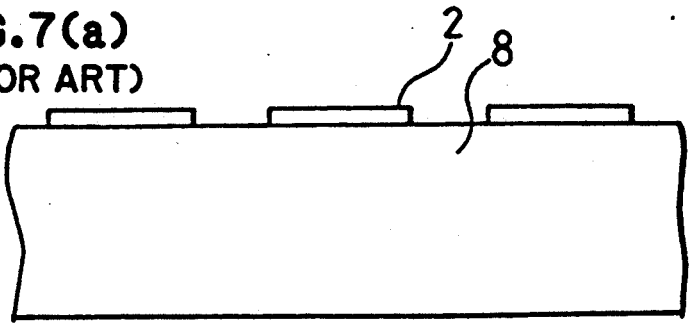
FIGS. 7(a) to 7(d) are cross-sectional views of process steps for producing another prior art semiconductor chip.
Figure 7B:
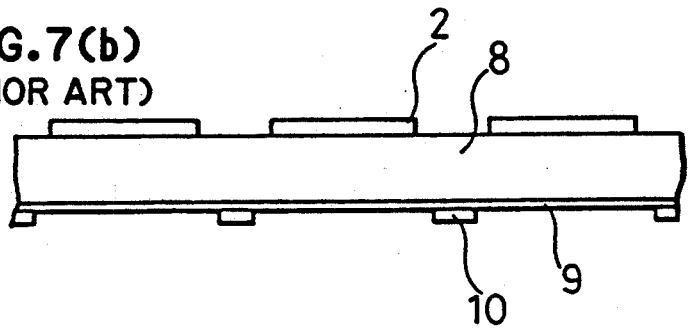
Figure 7C:
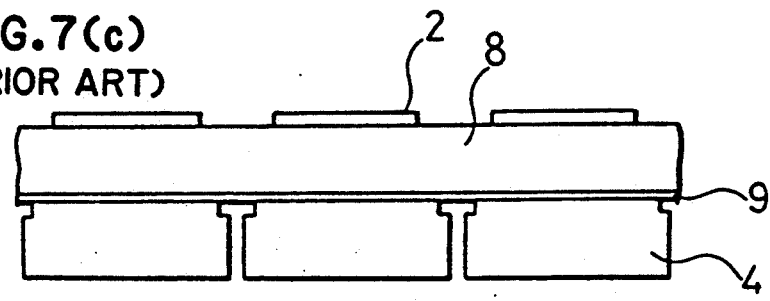
Figure 7D:
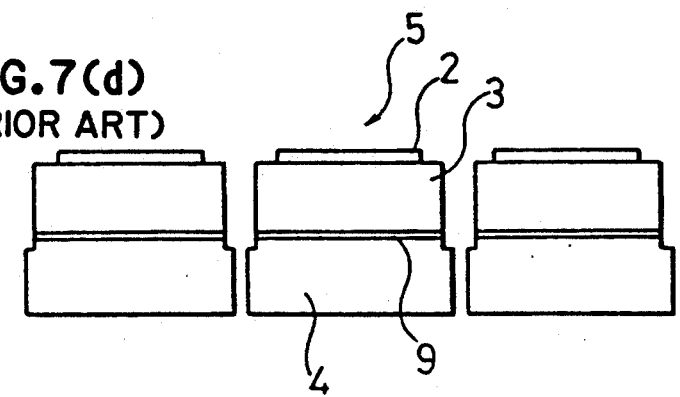

The processes shown in FIGS. 2(a) and 2(b) are the same as the prior art processes of FIGS. 6(a) and 6(b). As shown in FIG. 2(b), after a rear surface electrode 9 is produced, Au is plated on the rear surface of electrode 9 by electrolytic plating thereby to produce the PHS 4 of about 40 to 50 microns thickness. Thereafter, as shown in FIG. 2(c), an insulating radiating material 12 whose front and rear surfaces are metallized is adhered to the PHS 4 by thermocompression bonding and soldering. Finally, as shown in FIG. 2(d), the semiconductor wafer substrate 8 is separated into a plurality of semiconductor chip substrates by cutting grooves of about 100 microns width using a dual dicer, and further, the PHS 4 and the insulating radiating layer 12 are separated into a plurality of chips by producing cutting grooves of about 50 microns width.

In this embodiment, since the outside dimensions of hard insulating radiating layer 12 at the surface of PHS 4 of semiconductor chip 50 are larger than those of semiconductor chip substrate 3, the radiation layer 12 at the rear surface of semiconductor chip substrate 3 does not deform even when it is picked up by tweezers. That is, the tweezers do not come in contact with the semiconductor chip substrate 3 during handling of the chip, and therefore, the destruction of chip substrate, by cracks is prevented.

Furthermore, an insulating radiating layer 12 having thermal expansion coefficient approximately equal to that of the semiconductor chip substrate 3 is disposed under the PHS 4. Therefore, while fixing the semiconductor chip 50 onto the carrier 7 with a high temperature solder, the deformation of the semiconductor chip substrate 3 due to the heat can be suppressed by the radiating layer 12.

Figure 10A:
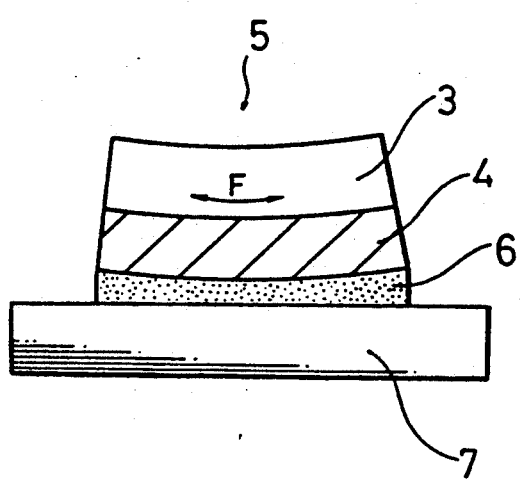
FIGS. 10(a) and 10(b) are diagrams comparatively showing the thermal stress applied to a semiconductor chip substrate of the device of the prior art and the present invention device.
Figure 10B:
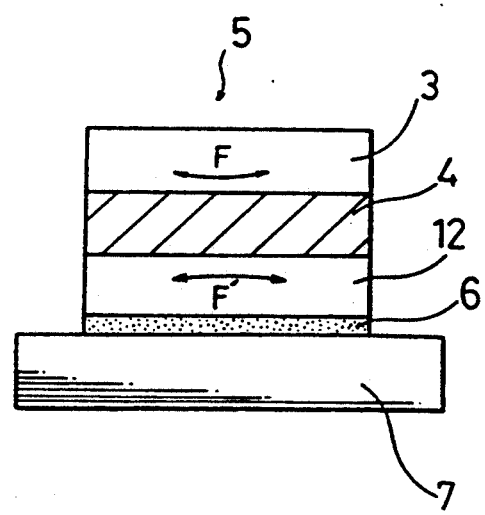
Figure 11A:
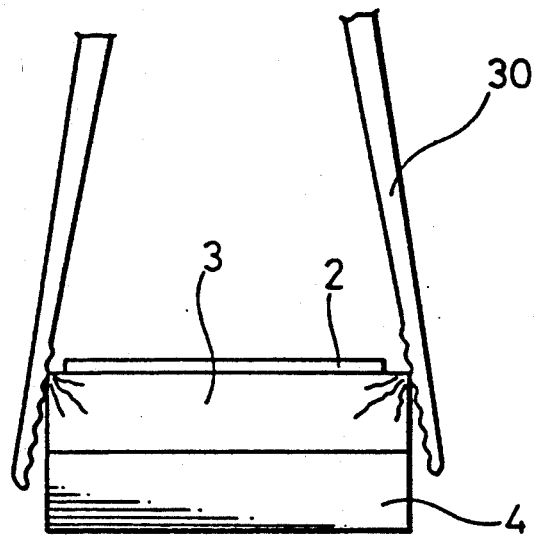
FIGS. 11(a) and 11(b) show the handling of the prior art device.
Figure 11B:
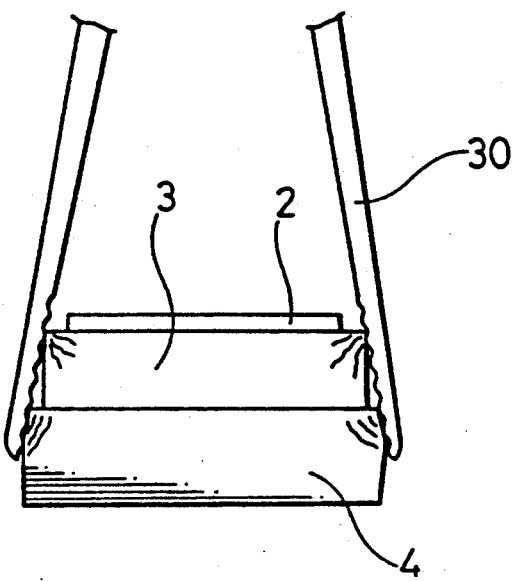

To be more precise, as shown in FIG. 10(b), by including the insulating radiating layer 12, the layer structure of semiconductor chip 50 is obtained, in which the PHS 4 having a large thermal expansion coefficient is sandwiched between the semiconductor chip substrate 3 having a small thermal expansion coefficient and the insulating radiating layer 12, and the thermal stress F arising at the junction between the substrate 3 and the PHS 4 is cancelled by the thermal stress F' arising at the junction between the PHS 4 and the radiating layer 12, whereby the deformation of the substrate 3 is prevented.

As a result, the semiconductor chip 50 face of deformation of chip substrate 3 can be mounted on the carrier, the thermal stress of the soldering process is released, and the characteristics and reliability of semiconductor chip 50 are enhanced.

Furthermore, while separating the semiconductor wafer into chips, the semiconductor wafer substrate 8 is cut by a blade having a predetermined thickness. The PHS 4 and the insulating radiating layer 12 are cut by a thinner blade than the above-described blade. Therefore, the cutting of substrate 8, PHS 4, and radiating layer 12 is mechanical and the outer dimensions of these layers can be precisely controlled. Furthermore, since the cutting of the semiconductor wafer substrate 8 and the cutting of the PHS 4 and radiating layer 12 are independently carried out under the conditions suitable for the materials, whereby the semiconductor wafer substrate 8 comprising soft material can be gently cut without breakage or cracking, and the radiating layers 4 and 12 comprising hard materials can be sharply cut.

While in the above-illustrated embodiment the PHS 4 and the insulating radiating layer 12 are cut together with a blade, the insulating radiating layer 12 may be cut with a thinner blade than the blade for cutting the PHS 4. More concretely, the PHS 4 and the radiating layer 12 may be separated from each other via cutting grooves of about 75 and about 50 microns width, respectively.

Figure 8A:
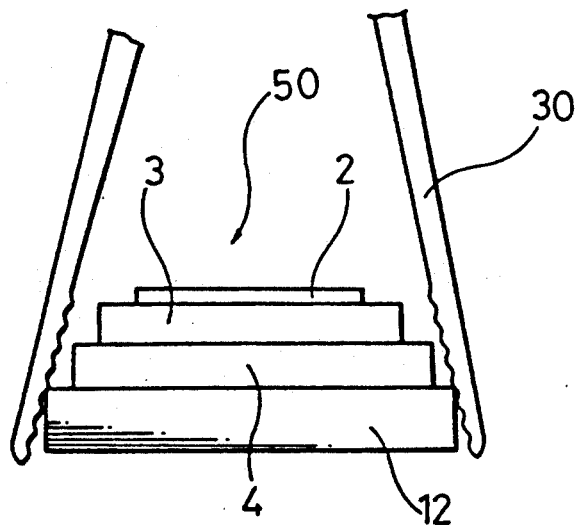
FIGS. 8(a) and 8(b) show the handling of the device of the present invention.
Figure 8B:
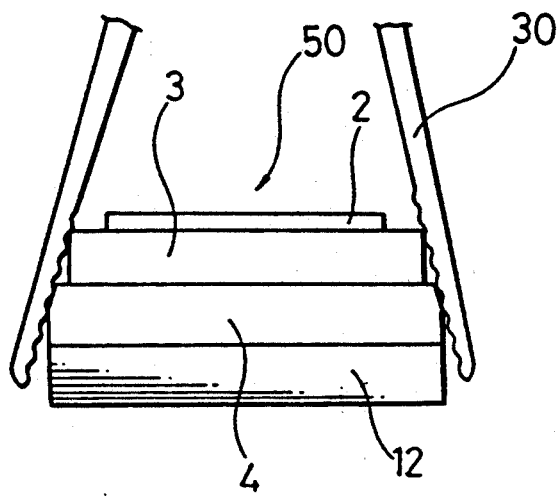
Figure 9:
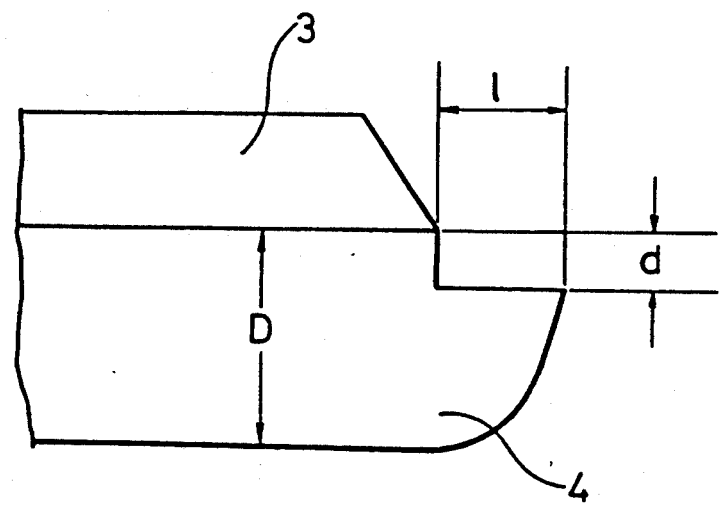
FIG. 9 is a diagram for explaining the relationship between the plating thickness of the PHS electrode and the extrusion distance of the electrode.

In this case, as shown in FIG. 8(a), the top ends of the tweezers 30 come in contact only with the hard insulating radiating layer 12, and the destruction of the semiconductor chip substrate 3 is reliably avoided. As shown in FIG. 8(b), when the outer dimensions of the PHS 4 and the insulating radiating layer 12 are equal to each other, the top ends of tweezers 30 come in contact with the PHS 4 comprising a soft material such as gold which deforms and stress is applied to the semiconductor chip substrate 3. When the PHS is largely deformed, the tweezers 30 come in direct contact with the semiconductor chip substrate 3. This problem can be prevented by making the outer dimensions of the insulating radiating layer 12 larger than that of the PHS 4.

While in the above-illustrated embodiment the laminar insulating radiating layer 12 is mounted to the PHS 4 by thermocompression bonding or soldering, a mixture of AlN or BN powder and conductive resin may be used as adhesive that is applied to the PHS 4 and hardened. Furthermore, the PHS 4 is not necessarily disposed over the entirety of the rear surface of semiconductor chip substrate 3. It may be selectively produced only at portions corresponding to the desired portions of respective semiconductor chips 50.

In the above-illustrated embodiment, the semiconductor device 100 includes the semiconductor chip 50 mounted on the carrier 7 with solder 6. However, when the semiconductor chip 50 is of a type in which the PHS 4 is used as a grounding electrode via a via-hole, it is impossible to effect grounding by making the PHS 4 and the carrier 7 directly contact each other.

Figure 3:
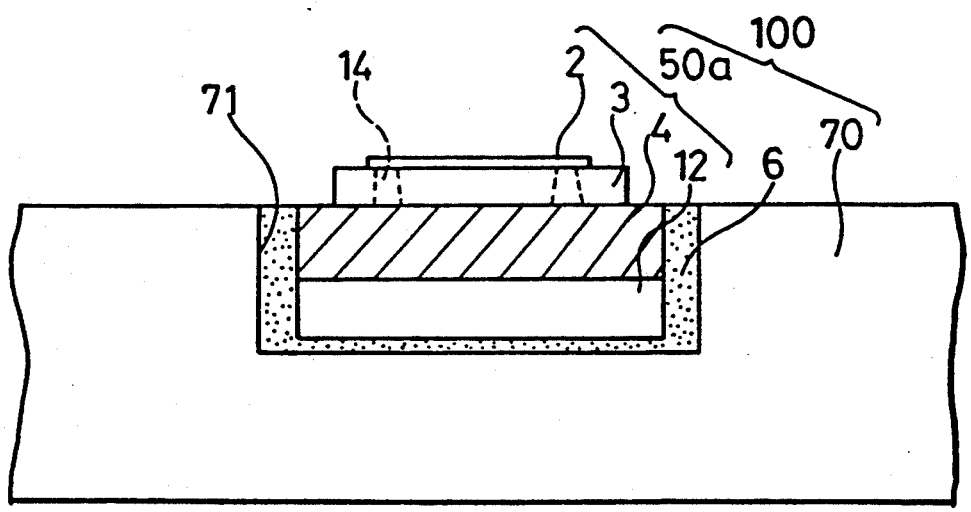
FIG. 3 is cross-sectional view of a semiconductor device according to a second embodiment of the present invention.

FIG. 3 shows a semiconductor device according to a second embodiment of the present invention. By employing the mounting method shown in FIG. 3, the PHS can be easily electrically connected with the carrier. In FIG. 3, a semiconductor chip 50a includes a semiconductor chip substrate 3 in which via-holes 14 are produced. The other structure of this chip 50a is the same as that of the device shown in FIG. 1. The carrier 70 has a concave portion 71 with a depth deeper than the thickness of the insulating radiating layer 12. The semiconductor chip 50a is arranged in the concave portion 71 of carrier 70, and a solder 6 fills the space between the chip 50a and the concave portion 71.

In this semiconductor device, since the semiconductor chip 50a is buried in the carrier 70 up to the PHS 4, the grounding electrode (not shown) at the surface of semiconductor chip 50a can be electrically connected with the carrier 70 via the via-hole 14 in the chip substrate 3, the PHS 4, and the solder 6, whereby the high-frequency characteristics are enhanced.

Figure 4:
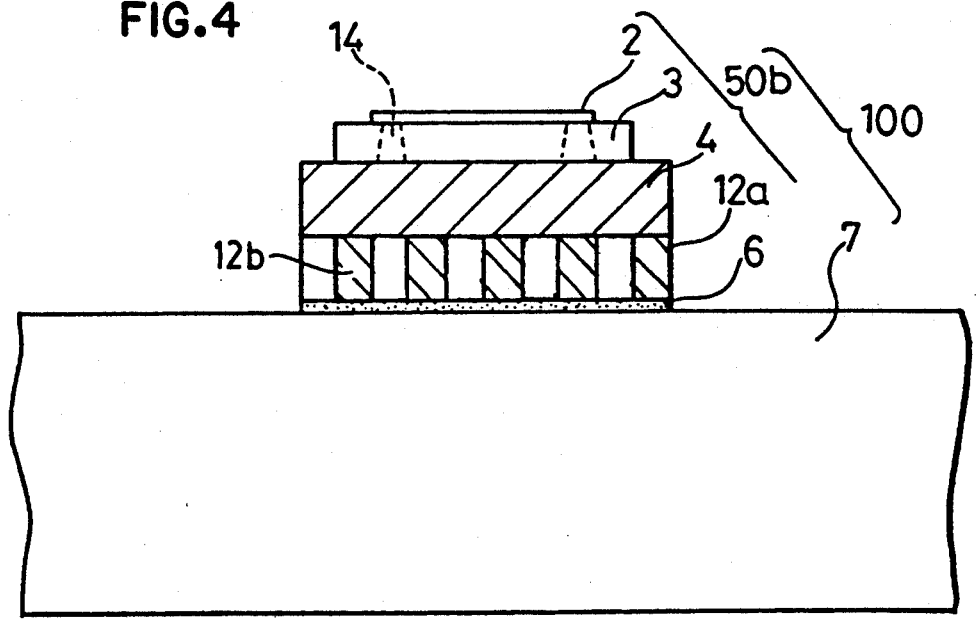
FIG. 4 is cross-sectional view of a semiconductor device according to a third embodiment of the present invention.
Figure 5:
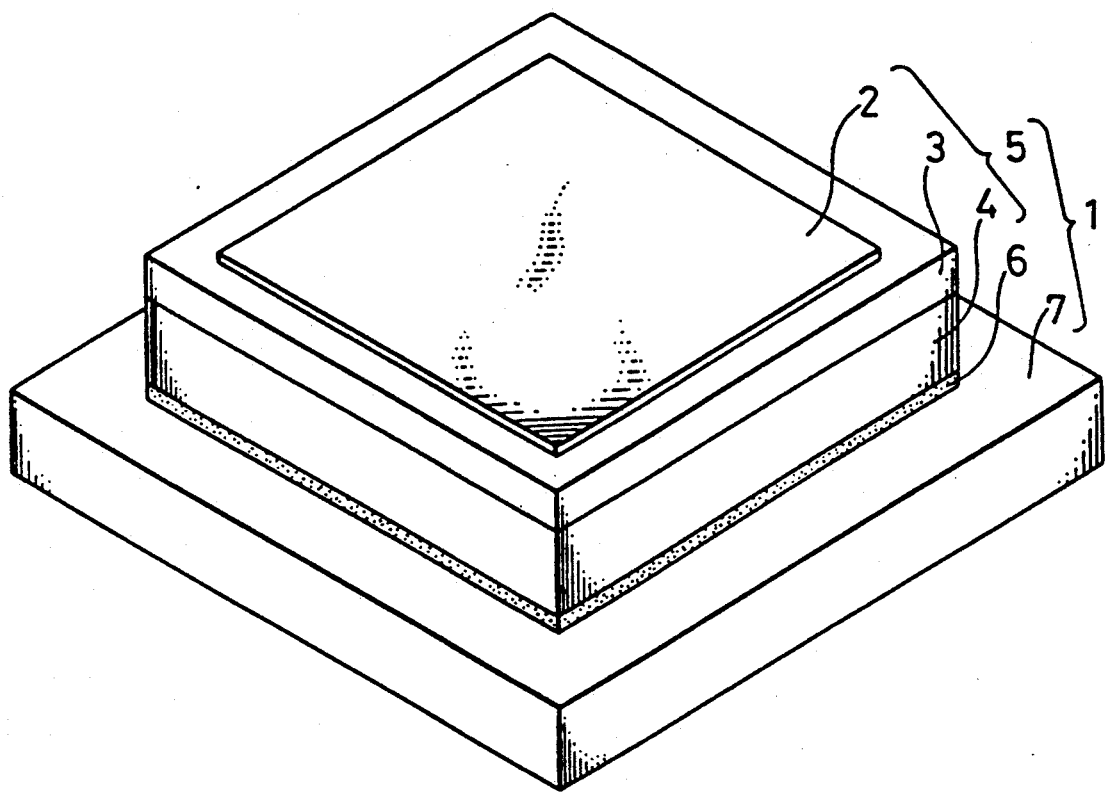
FIG. 5 is a perspective view of a semiconductor device provided with a radiating electrode according to the prior art.

FIG. 4 shows a semiconductor device in which a grounding electrode is required at the rear surface side of a semiconductor chip according to a third embodiment of the present invention. In this third embodiment, a plurality of through holes filled with a metal such as Au 12b are disposed in the insulating radiating layer 12a of semiconductor chip 50b, instead of in a concave portion in the carrier. In this device, the grounding electrode at the surface of semiconductor chip 50b can be electrically connected with the carrier 7, whereby the high-frequency characteristics are enhanced.

As is evident from the foregoing description, according to the present invention, a radiating electrode and a hard radiating layer are successively deposited on the rear surface of semiconductor chip substrate, and the outer configuration size of hard radiating layer is larger than that of semiconductor chip substrate. Therefore, the handling tool does not come in contact with the semiconductor chip substrate during handling of the semiconductor chip, whereby the destruction of the semiconductor chip is avoided.

The radiating layer at the rear surface side of semiconductor chip includes a radiating electrode on the rear surface of semiconductor chip substrate and a radiating layer on the surface of the radiating electrode having a thermal expansion coefficient approximately equal to that of semiconductor chip substrate. Therefore, the deformation of the semiconductor chip substrate during a high temperature soldering process can be prevented, whereby the characteristics and reliability of device are enhanced.

A carrier for mounting a semiconductor chip thereon includes a concave portion deeper than the thickness of an insulating radiating layer of the semiconductor chip, and the semiconductor chip is buried in the concave portion of carrier and is adhered therein by solder. Therefore, the radiating electrode as a grounding electrode can be electrically connected with the carrier via the solder whereby the high-frequency characteristics of device is enhanced.

Since an insulating radiating layer at the rear surface of the semiconductor chip has through-holes filled with a metal, the grounding radiating electrode can be electrically connected with the carrier via the through-holes, thereby enhancing the high frequency characteristics of the device.

Furthermore, according to a method of producing a semiconductor device of the present invention, when the semiconductor wafer is divided into a plurality of chips, the semiconductor wafer substrate is cut by a blade having a predetermined thickness, and the radiating electrode and the insulating radiating layer are cut by a thinner blade. Therefore, the cutting of substrate, radiating electrode and radiating layer are mechanical, and the outer dimensions of semiconductor chip substrate and radiating layers can be precisely controlled. Furthermore, the cutting can be carried out under conditions suitable for the materials, whereby the semiconductor wafer substrate comprising soft material can be gently cut without causing breakage or cracks and the radiating layers comprising hard material can be sharply cut.

What is claimed is:

1. A semiconductor device comprising:
   a semiconductor substrate having front and rear surfaces, and a grounding radiating electrode and an insulating radiating layer successively disposed on the rear surface of said substrate; and
   a carrier to which said semiconductor substrate is mounted with solder, said carrier including a recess, said insulating radiating layer and said ground radiating electrode being disposed within said recess of said carrier, said solder being disposed in the recess contacting said carrier, said grounding radiating electrode, and insulating radiating layer, said solder separating said grounding radiating electrode and said insulating radiating layer from said carrier and electrically connecting said grounding radiating electrode to said carrier wherein a via hole penetrates said semiconductor substrate and extends to said grounding radiating electrode, electrically connecting said semiconductor substrate with said grounding radiating electrode.

* * * * *

UNITED STATES PATENT AND TRADEMARK OFFICE
CERTIFICATE OF CORRECTION

PATENT NO. : 5,138,439

DATED : August 11, 1992

INVENTOR(S) : Michihiro Kobiki

It is certified that error appears in the above-identified patent and that said Letters Patent is hereby corrected as shown below:

Claim 1, column 8, line 29, change "ground" to --grounding--.

Signed and Sealed this

Twenty-first Day of September, 1993

Attest:

BRUCE LEHMAN

Attesting Officer

Commissioner of Patents and Trademarks